United States Patent
Kubena

(10) Patent No.: US 12,483,224 B1
(45) Date of Patent: Nov. 25, 2025

(54) ACOUSTICALLY COUPLED DUAL RESONATORS FOR PHONONIC FREQUENCY COMB GENERATION

(71) Applicant: HRL Laboratories, LLC, Malibu, CA (US)

(72) Inventor: Randall L. Kubena, Oak Park, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 828 days.

(21) Appl. No.: 17/841,344

(22) Filed: Jun. 15, 2022

Related U.S. Application Data

(60) Provisional application No. 63/222,880, filed on Jul. 16, 2021.

(51) Int. Cl.
*H03H 9/17* (2006.01)
*H03H 9/13* (2006.01)
*H03H 9/205* (2006.01)

(52) U.S. Cl.
CPC .............. *H03H 9/205* (2013.01); *H03H 9/13* (2013.01); *H03H 9/17* (2013.01)

(58) Field of Classification Search
CPC .. H03H 9/17; H03H 9/13; H03H 9/19; H03H 2009/02488; H03H 9/02062; H03H 9/02551; H03H 9/584; H03H 9/706; H03H 9/205; H03H 9/56; H03H 9/02023; H03H 3/04

See application file for complete search history.

(56) References Cited

U.S. PATENT DOCUMENTS

| | | | |
|---|---|---|---|
| 4,070,635 A | 1/1978 | Healey, III | |
| 4,132,964 A | 1/1979 | Wilcox | |
| 7,237,315 B2 * | 7/2007 | Kubena | H03H 3/04 29/25.35 |
| 7,459,099 B2 | 12/2008 | Kubena | |
| 7,557,677 B1 * | 7/2009 | Hsu | H03H 9/56 333/191 |
| 7,750,535 B2 | 7/2010 | Kubena | |
| 7,786,825 B2 * | 8/2010 | Handtmann | H03H 9/589 333/189 |
| 7,851,971 B2 | 12/2010 | Chang | |

(Continued)

FOREIGN PATENT DOCUMENTS

| | | |
|---|---|---|
| KR | 10-2008-0044977 | 5/2008 |
| KR | 10-2012-0132987 | 12/2012 |

(Continued)

OTHER PUBLICATIONS

U.S. Appl. No. 17/567,034 (non-publication request filed), Office Action dated Jun. 7, 2023.

(Continued)

*Primary Examiner* — Dominick L Plakkoottam
(74) *Attorney, Agent, or Firm* — Ladas & Parry, LLP

(57) ABSTRACT

A resonator structure comprising of two sets of top and bottom electrodes disposed on a common piezoelectric substrate forming first and second acoustically coupled resonators with different resonant frequencies and which are driven by common signal source on the top electrodes at a frequency between the two resonant frequencies and at a power sufficient for nonlinear operation, thereby producing a phononic frequency comb output.

16 Claims, 6 Drawing Sheets

(56) References Cited

U.S. PATENT DOCUMENTS

| | | | |
|---|---|---|---|
| 8,569,937 B1* | 10/2013 | Kubena | H03H 9/17 |
| | | | 310/309 |
| 8,601,607 B2 | 12/2013 | Hagmann | |
| 8,765,615 B1 | 7/2014 | Chang | |
| 8,994,465 B1 | 3/2015 | Kubena | |
| 10,110,198 B1 | 10/2018 | Kubena | |
| 10,389,392 B1 | 8/2019 | Kubena | |
| 10,819,276 B1* | 10/2020 | Kubena | H03H 9/22 |
| 11,156,897 B2 | 10/2021 | Kubena | |
| 11,239,823 B1 | 2/2022 | Kubena | |
| 11,275,099 B1 | 3/2022 | Sorenson | |
| 11,431,293 B1 | 8/2022 | Kubena | |
| 2007/0279153 A1* | 12/2007 | Ruby | H03H 9/174 |
| | | | 333/191 |
| 2010/0321117 A1 | 12/2010 | Gan | |
| 2012/0294319 A1 | 11/2012 | Maleki | |
| 2013/0083044 A1* | 4/2013 | Zuo | H03H 9/2405 |
| | | | 310/365 |
| 2013/0214879 A1* | 8/2013 | Gorisse | H03H 9/02086 |
| | | | 333/191 |
| 2015/0115777 A1* | 4/2015 | Yun | H03H 9/02157 |
| | | | 310/366 |
| 2015/0326320 A1 | 11/2015 | Fertig | |
| 2017/0047893 A1 | 2/2017 | Nguyen | |
| 2018/0157148 A1 | 6/2018 | Kim | |
| 2019/0036512 A1* | 1/2019 | Yen | H03H 9/02118 |
| 2019/0181611 A1 | 6/2019 | Maleki | |
| 2019/0250198 A1 | 8/2019 | Kubena | |
| 2020/0158769 A1 | 5/2020 | Liu | |
| 2020/0357849 A1* | 11/2020 | Northcutt | H10N 30/101 |
| 2020/0358422 A1* | 11/2020 | Northcutt | H03H 9/10 |
| 2020/0382097 A1* | 12/2020 | Li | H03H 9/02275 |
| 2021/0091748 A1* | 3/2021 | Kubena | G02F 1/353 |
| 2021/0356839 A1* | 11/2021 | Ansari | H03H 9/02078 |

FOREIGN PATENT DOCUMENTS

| | | |
|---|---|---|
| WO | 2014-018444 | 1/2014 |
| WO | 2019/217668 | 11/2019 |

OTHER PUBLICATIONS

U.S. Appl. No. 16/932,431, Kubena, filed Jul. 17, 2020.
U.S. Appl. No. 17/677,849, Kubena, filed Feb. 22, 2022.
U.S. Appl. No. 17/567,034, Kubena, filed Dec. 31, 2021.
U.S. Appl. No. 16/775,242, Kubena, filed Jan. 28, 2020.
U.S. Appl. No. 16/932,427, Kubena, filed Jul. 17, 2020.
U.S. Appl. No. 16/932,447, Kubena, filed Jul. 17, 2020.
From U.S. Appl. No. 16/932,455 (now published as U.S. Pat. No. 11,156,897), Notice of Allowance mailed on Jun. 23, 2021.
From U.S. Appl. No. 16/932,455 (now published as U.S. Pat. No. 11,156,897), Office Action mailed on Apr. 22, 2021.
From U.S. Appl. No. 17/348,344 (now published as U.S. Pat. No. 11,431,293), Notice of Allowance mailed on Apr. 26, 2022.
From U.S. Appl. No. 17/348,344 (now published as U.S. Pat. No. 11,431,293), Office Action mailed on Jan. 27, 2022.
PCT International Search Report and Written Opinion from PCT/US2020/051863 dated Jan. 4, 2021.
PCT International Preliminary Report on Patentability Chapter I from PCT/US2020/051863 dated Apr. 7, 2022.
Analog Devices, Phase Detector/Frequency Synthesizer model ADF4002, Norwood, MA, 2006-2015, 20 pages.
Askari, S. et al., "Near-Navigation Grade Quad Mass Gyroscope With Q-Factor Limited by Thermo-Elastic Damping," Solid-State, Actuators, and Microsystems Workshop Technical Digest, Hilton Head, South Carolina, USA, 2016, pp. 254-257.
Bennett, S. P. et al., "Magnetic Field Response of Doubly Clamped Magnetoelectric Microelectromechanical AlN—FeCo Resonators," Applied Physics Letters 111, 252903 (2017), 6 pages.
Bhatia, A. et al., "Linearization of Phase-Modulated Analog Optical Links using a Four-Wave Mixing Comb Source," Optics Express, DOI: 10.1364/OE 22.030899, Dec. 4, 2014, 11 pages.

Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.
Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).
Ganesan, A., et al., "Phononic Frequency Combs for Engineering MEMS/NEMS Devices with Tunable Sensitivity," 2019 IEEE (4 pages).
Ganesan, A. et al., "Phononic Frequency Comb via Intrinsic Three-Way Mixing," Physical Review Letters, PRL 118, 033903 (2017), (5 pages).
Hati, A. et al., "Oscillator PM noise reduction from correlated AM noise," IEEE Transactions on Ultrasonics, Ferroelectrics, and Frequency Control. vol. 63, No. 3 (Mar. 2016): 463-469.
Hati, A., et al., "Reducing oscillator PM noise from AM-PM noise correlation," Electronics Letters, vol. 50, No. 17 (2014): 1195-1197.
Howe, et al., "PM-AM correlation measurements and analysis," May 2012, IEEE International Frequency Control Symposium Proceedings (pp. 1-5).
Hui, Y. et al., "High Resolution Magnetometer Based on a High Frequency Magnetoelectric MEMS-CMOS Oscillator," Journal of Micromechanical Systems, vol. 24, No. 1, Feb. 2015, pp. 134-143.
Kominis, et al., "A subfemtotesla multichannel atomic magnetometer," Nature, vol. 422, pp. 596-599 (2003).
Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.
Kubena, et al., "A Fully Integrated Quartz MEMS VHF TCXO," 2017 IEEE Frequency Control Symposium, Besancon, Fr., pp. 68-71, Jul. 2017.
Leeson, D. B., et al., "Short-term Stability for a Doppler Radar: Requirements, Measurements, and Techniques," Proceedings of IEEE, vol. 54, No. 2, pp. 244-248, Feb. 1966).
Nan, et.al., "Acoustically Actuated Ultra-Compact NEMS Magnetoelectric Antenna," Nature Communications, 8:296, DOI: 10.1038/s41467-017-00343-8 (2017), pp. 1-8.
Neji, N. et al., FPGA Implementation of the CORDIC Algorithm for Fingerprints Recognition Systems, International Journal of Computer Applications, vol. 63, No. 6, Feb. 2013, pp. 39-45.
Pinto, A. N., "Timing Jitter in Optical Communication Systems," Frontiers in Optics, OSA Technical Digest (CD) (Optical Society of America, 2006), paper FMD5 (1 page).
Quitin, François, et al., "Distributed receive beamforming: A scalable architecture and its proof of concept." 2013 IEEE 77th Vehicular Technology Conference (VTC Spring) (5 pages).
Roy, S., FPGA implementation of 8-point FFT, May 14, 2019 available on-line at https://digitalsystemdesign.in/fpga-implementation-of-8-point-fft (Printed on Apr. 1, 2022).
Sheng, et al., "A Microfabricated Optically-Pumped Magnetic Gradiometer," Applied Physics Letters 110, 031106 (2017), 5 pages.
Trochimiuk, M., "FPGA programming how it works and where it can be used" available online at https://codilime.com/blog/FPGA-programming-how-it-works-and-where-it-can-be-used/ (Printed on Apr. 1, 2022).
Veryaskin, A. "Gravity, Magnetic and Electromagnetic Gradiometry: Strategic Technologies in the 21st century", IOP ebooks, 2018 (57 pages).
Vrba, J., "SQUID Sensors: Fundamentals, Fabrication and Applications," edited by H. Weinstock, Kluwer Academic, Dordrecht, The Netherlands, 1996, p. 117.
Wall, W. S., et al., "Phase Noise Transfer in High-Q Quartz Phononic Frequency Combs," 2020 IEEE Ultrasonics Sym., Las Vegas, NV. Sep. 6-11, 2020, 4 pages.
Wang, S. et al., "A MEMS Resonant Accelerometer for Low-Frequency Vibration Detection," Sensors and Actuators A: Physical, 283, Nov. 2018, pp. 151-158.
WenJie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.

(56) References Cited

OTHER PUBLICATIONS

Yao, et. al., "Bulk Acoustic Wave-Mediated Multiferroic Antennas: Architecture and Performance Bound," IEEE Transactions on Antennas and Propagation, vol. 63, No. 8, Aug. 2015, pp. 3335-3344.
Zhai, J., et al., "Detection of Pico-Tesla Magnetic Fields using Magneto-Electric Sensors at Room Temperature," Applied Physics Letters, 88, 062510 (2006), 5 pages.
U.S. Appl. No. 16/775,242, filed Jan. 28, 2020 (Inventor: Kubena, non-publication request filed).
U.S. Appl. No. 16/932,427, filed Jul. 17, 2020 (Inventor: Kubena, non-publication request filed).
U.S. Appl. No. 16/932,447, filed Jul. 17, 2020 (Inventor: Kubena, non-publication request filed).
U.S. Appl. No. 16/932,431, filed Jul. 17, 2020, (Inventor: Kubena, non-publication request filed).
U.S. Appl. No. 17/677,849, filed Feb. 22, 2022, (Inventor: Kubena, non-publication request filed).
U.S. Appl. No. 17/567,034, filed Dec. 31, 2021, (Inventor: Kubena, non-publication request filed).
From U.S. Appl. No. 17/567,034 (non-publication request filed), Office Action dated Feb. 10, 2023.
From U.S. Appl. No. 17/567,034 (non-publication request filed), Office Action dated Oct. 3, 2022.
Park, Mingyo and Azadeh Ansari, "Phononic frequency combs in stand-alone piezoelectric resonators," 2018 IEEE International Frequency Control Symposium (IFCS), IEEE, 2018.
Kubena, R. L., Wall, W. S., Koehl, J., and Joyce, R. J., "Phononic Comb Generation in High-Q Quartz Resonators," Applied Physics Letters, 116, 053501, Feb. 4, 2020.
Kubena, R. L., Yong, Y. K., Wall, W. S., Koehl, J., & Joyce, R. J., "Nonlinear Analysis of Phononic Comb Generation in High-Q Quartz Resonators," 2020 Joint Conference of the IEEE International Frequency Control Symposium and International Symposium on Applications of Ferroelectrics (IFCS-ISAF) pp. 1-5 Jul. 2020.
Czaplewski, David A., Shaw, Steven W., Shoshani, Oriel, Dykman, Mark I., and Lopez, Daniel, "Frequency Comb Generation In A Nonlinear Resonator Through Mode Coupling Using A Single Tone Driving Signal" Solid-State Sensors, Actuators and Microsystems Workshop Hilton Head Island, South Carolina, Jun. 3-7, 2018.
Ganesan, Adarsh et al., "Phononic frequency comb via three-mode parametric resonance," Applied Physics Letters 112.2 (2018): 021906.
Qi, Z., Menyuk, C. R., Gorman, J. J., & Ganesan, A., "Existence conditions for phononic frequency combs," Applied Physics Letters, 117(18), 183503, 2020.
Singh, R., Sarkar, A., Guria C., Nicholl, R., Chakraborty, S. Bolotin, K., and Ghosh, S., "Giant Tunable Mechanical Nonlinearity in Graphene-Silicon Nitride Hybrid Resonator," published Jun. 23, 2020.

* cited by examiner

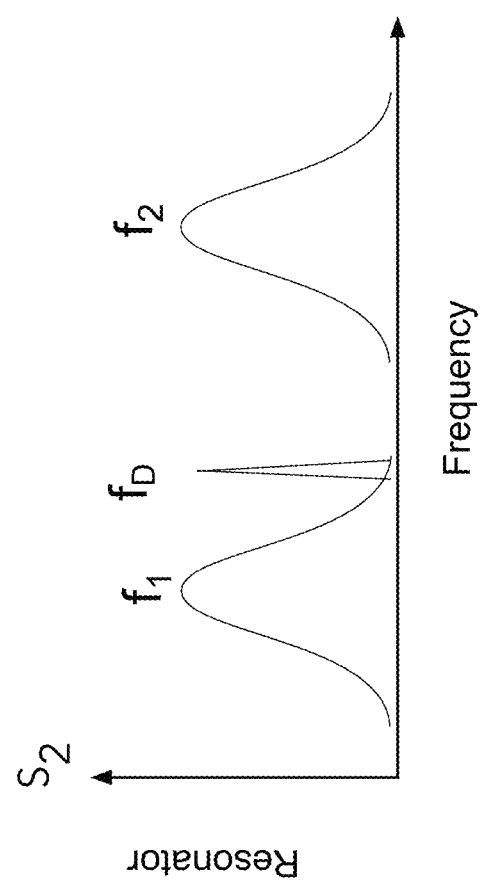

ACOUSTICALLY COUPLED DUAL RESONATORS FOR PHONONIC FREQUENCY COMB GENERATION

CROSS REFERENCE TO RELATED APPLICATIONS

This application claims the benefit of U.S. Provisional Patent Application Ser. No. 63/222,880 filed 16 Jul. 2021 and entitled "Acoustically Coupled Dual Resonators for Phononic Frequency Comb Generation," the disclosure of which is hereby incorporated herein by reference.

This application is related to U.S. Provisional Patent Application Ser. No. 63/083,619 filed 25 Sep. 2020 and entitled "Noise Suppression in a Phononic Comb" and to its related non-provisional patent application Ser. No. 17/348,344 filed 15 Jun. 2021, the disclosures of which are hereby incorporated herein by reference.

This application is also related to the technology disclosed in U.S. Provisional Patent Application Ser. No. 62/904,052, filed 23 Sep. 2019, and entitled "Enhanced Stability Oscillators using a Phononic Comb," and to its related non-provisional patent application Ser. No. 16/932,455, filed 17 Jul. 2020, and having the same title as its related provisional application, the disclosures of which are hereby incorporated herein by reference.

This application is also related to the technology disclosed in U.S. Provisional Patent Application Ser. No. 62/881,069, filed 31 Jul. 2019 and entitled "Phononic Comb Enhanced Gradiometers" and its corresponding non-provisional patent application Ser. No. 16/932,431, filed 17 Jul. 2020, and having the same title as its related provisional application, the disclosures of which are hereby incorporated herein by reference.

This application is also related to the technology disclosed in U.S. Provisional Patent Application Ser. No. 63/152,506 filed 23 Feb. 2021 and entitled "Comb Enhanced Oscillator with AM-to-PM Noise Suppression," the disclosure of which is hereby incorporated herein by reference.

This application is also related to the technology disclosed in U.S. Provisional Patent Application Ser. No. 63/144,614 filed 2 Feb. 2021 and entitled "Phononic Comb Enhanced Atomic Clock," the disclosure of which is hereby incorporated herein by reference.

STATEMENT REGARDING FEDERALLY SPONSORED RESEARCH OR DEVELOPMENT

None.

TECHNICAL FIELD

Acoustically coupled dual resonators for use in phononic frequency comb generation.

BACKGROUND

As described in U.S. Provisional Patent Application Ser. No. 62/904,052, filed 23 Sep. 2019, and entitled "Enhanced Stability Oscillators using a Phononic Comb," and to its related non-provisional patent application Ser. No. 16/932,455, filed 17 Jul. 2020, and having the same title as its related provisional application, phononic frequency combs may be useful for clock, sensor, radar, or communication network applications.

In previous demonstrations of phononic frequency comb generation, a single resonator with multiple internal modes, such as fundamental, anharmonic, flexural, extensional, or torsional modes, couple nonlinearly with the drive frequency to produce a phononic comb. See, for example, (i) Ganesan, Adarsh et al., "Phononic frequency comb via three-mode parametric resonance," *Applied Physics Letters* 112.2 (2018): 021906; (ii) Park, Mingyo and Azadeh Ansari, "Phononic frequency combs in stand-alone piezoelectric resonators," 2018 *IEEE International Frequency Control Symposium (IFCS), IEEE,* 2018; and (iii) Kubena, R. L., Wall, W. S., Koehl, J., and Joyce, R. J., "Phononic Comb Generation in High-Q Quartz Resonators," *Applied Physics Letters,* 116, 053501, Feb. 4, 2020.

The theoretical basis of phononic frequency comb generation is currently being developed. See (i) Kubena, R. L., Yong, Y. K., Wall, W. S., Koehl, J., & Joyce, R. J., "Nonlinear Analysis of Phononic Comb Generation in High-Q Quartz Resonators," in 2020 *Joint Conference of the IEEE International Frequency Control Symposium and International Symposium on Applications of Ferroelectrics (IFCS-ISAF)* pp. 1-5 Jul. 2020; (ii) Qi, Z., Menyuk, C. R., Gorman, J. J., & Ganesan, A., "Existence conditions for phononic frequency combs," *Applied Physics Letters,* 117(18), 183503, 2020; (iii) Czaplewski, David A., Shaw, Steven W., Shoshani, Oriel, Dykman, Mark I., and Lopez, Daniel, "Frequency Comb Generation In A Nonlinear Resonator Through Mode Coupling Using A Single Tone Driving Signal" in *Solid-State Sensors, Actuators and Microsystems Workshop Hilton Head Island, South Carolina,* Jun. 3-7, 2018; and Singh, R., Sarkar, A., Guria C., Nicholl, R., Chakraborty, S. Bolotin, K., and Ghosh, S., "Giant Tunable Mechanical Nonlinearity in Graphene-Silicon Nitride Hybrid Resonator," published 23 Jun. 2020, see arxiv.org/pdf/1904.01613.pdf.

The latest explanation is that two modes couple nonlinearly with the drive signal to produce the comb. Presently, only single resonators have been studied using existing resonators fabricated for other applications. However, custom resonator designs provide an opportunity to explore coupled modes in separate resonators. This document takes these ideas and applies them to piezoelectric Bulk Acoustic Wave (BAW) resonators for the first time.

In this application, a description is provided of a new structure that can produce phononic combs which consists of two resonators located on a common piezoelectric substrate with tailored frequency separations between their modes when this new structure is properly excited. This allows the frequency separation of the modes and the modal properties or characteristics of each mode such as which type of mode is excited in each resonator (shear, flexural, torsional, or anharmonic or overtone modes of each, etc.), the Q, and the nonlinear duffing and coupling constants of the resonators to be determined by 1) fabricating different lateral sizes or thicknesses for the active areas and/or electrodes of each resonator and 2) varying the resonator separation between the two resonators. The degree of acoustical coupling is determined by the spacing between the two sets of electrodes on the common substrate. The two modes can have similar temperature sensitivities to provide high stability of the resulting comb. The non-linear duffing constant is in the duffing equation. See, for example, en.wikipedia.org/wiki/Duffing_equation. Other constants that may also be varied in the duffing equation include the nonlinear coupling terms between the modes and the damping of each mode.

Recent theoretical modeling of phononic combs in quartz shear-mode resonators has shown that combs can be formed by two coupled modes nonlinearly interacting with a drive signal at a frequency located between the two modes. Both experiments and theory show that the separation between the teeth of the comb (which is important for bandwidth and filtering for use within a PLL) is determined in part by the frequency separation between the modes. Thus, a practical method is needed for adjusting this separation. When a single resonator is used, the adjacent modes are determined by the design of the resonator (such as the size of the piezoelectric substrate, the dimensions of the electrodes and mounting conditions.) In addition, in some cases, the adjacent modes may not have the same temperature coefficients. Thus, the comb may have a larger temperature sensitivity than a thermally compensated mode. For engineering the comb characteristics, it would be beneficial if the mode type and separation could be easily controlled during the fabrication process with simple process changes. In addition, in order to allow engineering of the comb properties, the Q and the degree of nonlinear duffing of each mode can be modified by adjusting the geometry of the active area of each resonator (by adjusting the size of a mesa or inverted mesa which controls the modal trapping of each resonator) and the dimensions and geometry of the electrodes of each resonator.

This application describes a structure similar to a monolithic crystal filter in which the coupling between adjacent resonators is determined by the separation between the electrodes located on a common piezoelectric substrate. The frequency of the modes can be controlled by varying the lateral dimensions or the thickness of the active areas or the electrodes, and similar or dissimilar modes types (e.g., fundamental, flexural, or torsional modes) can easily couple.

Reference oscillators are used, for example, in radar systems. As radar and communication links move to higher frequency mm-wave operation, the phase noise of the local oscillator limits channel capacity, range, bandwidth, and bit error rate (BER). For a 20 dB reduction in phase noise, the channel capacity of high-data-rate communication networks can improve by 100x, the range of wideband radar systems can improve by 3x, and the bandwidth of EW receivers can improve by 10x. For wireless communication, local frequency stability and timing accuracy improvements of >10x (ADEV improvements from $10^{-11}$ to $10^{-12}$ and timing accuracy from 1 μs to <100 ns) are needed to move from 4G technology to future 6G systems. In addition, as frequencies increase, a higher density of low c-SWaP clocks is needed for local timing nodes due to limited penetration of signals through buildings and natural barriers. There is also a need for better timing synchronization in GPS-denied environments. Thus, there is both a commercial and military need for improved low cost, small, and low phase noise clocks. This new resonator design for the nonlinear element could be used with the various inventions discussed in the patent applications referenced above.

BRIEF DESCRIPTION OF THE INVENTION

As noted above, previous demonstrations of phononic combs have been performed with single resonators with multiple internal modes which are excited by an external drive. These single resonators necessitate using different types of modes for coupling such as shear, anharmonic, bulk, extensional, flexural, or torsional modes. In many cases, the mode spacings are not easily controlled for optimal resonator Qs, duffing or temperature stability of certain modes.

In this disclosure, two resonators are acoustically coupled by placing them in close proximity to each other on a common piezoelectric substrate. The coupling strength is determined by the separation between the resonators and the energy trapping provided by the electrodes. Acoustical energy leaks from one resonator to the other in the piezoelectric substrate and creates the nonlinear coupling needed for comb formation. The frequency separation between modes with closely spaced resonant frequencies can be varied by fabricating each resonator with a different size or thickness of the electrodes or active areas. In the first embodiment, the resonators are driven in parallel so that both modes are excited by the drive signal while the capacitive coupling through the piezoelectric substrate is common between the two resonators. In a second embodiment, the first resonator is driven, and the second resonator is only acoustically coupled to the drive and first mode with the comb formation observed on the second resonator.

In one aspect the present invention relates to a resonator structure comprising of two sets of top and bottom electrodes disposed on a common piezoelectric substrate forming first and second acoustically coupled resonators with different resonant frequencies and which are driven by common signal source on the top electrodes at a frequency between the two resonant frequencies and at a power sufficient for nonlinear operation, thereby producing a phononic frequency comb output.

In another aspect the present invention relates to a resonator structure consisting of two sets of top and bottom electrodes on a common piezoelectric substrate forming first and second acoustically coupled resonators with different resonant frequencies and which are driven by a signal source between the top and bottom electrodes of the said first resonator at a frequency between the two resonant frequencies and at a power needed for nonlinear operation, thereby producing a phononic frequency comb across the electrodes of the said second resonator.

BRIEF DESCRIPTION OF THE DRAWINGS

FIG. 1a is a graph showing the output signal S2 when there is either insufficient coupling between the two resonators and/or the drive signal $f_D$ is of insufficient magnitude to illicit the non-linear response.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Figure 1:
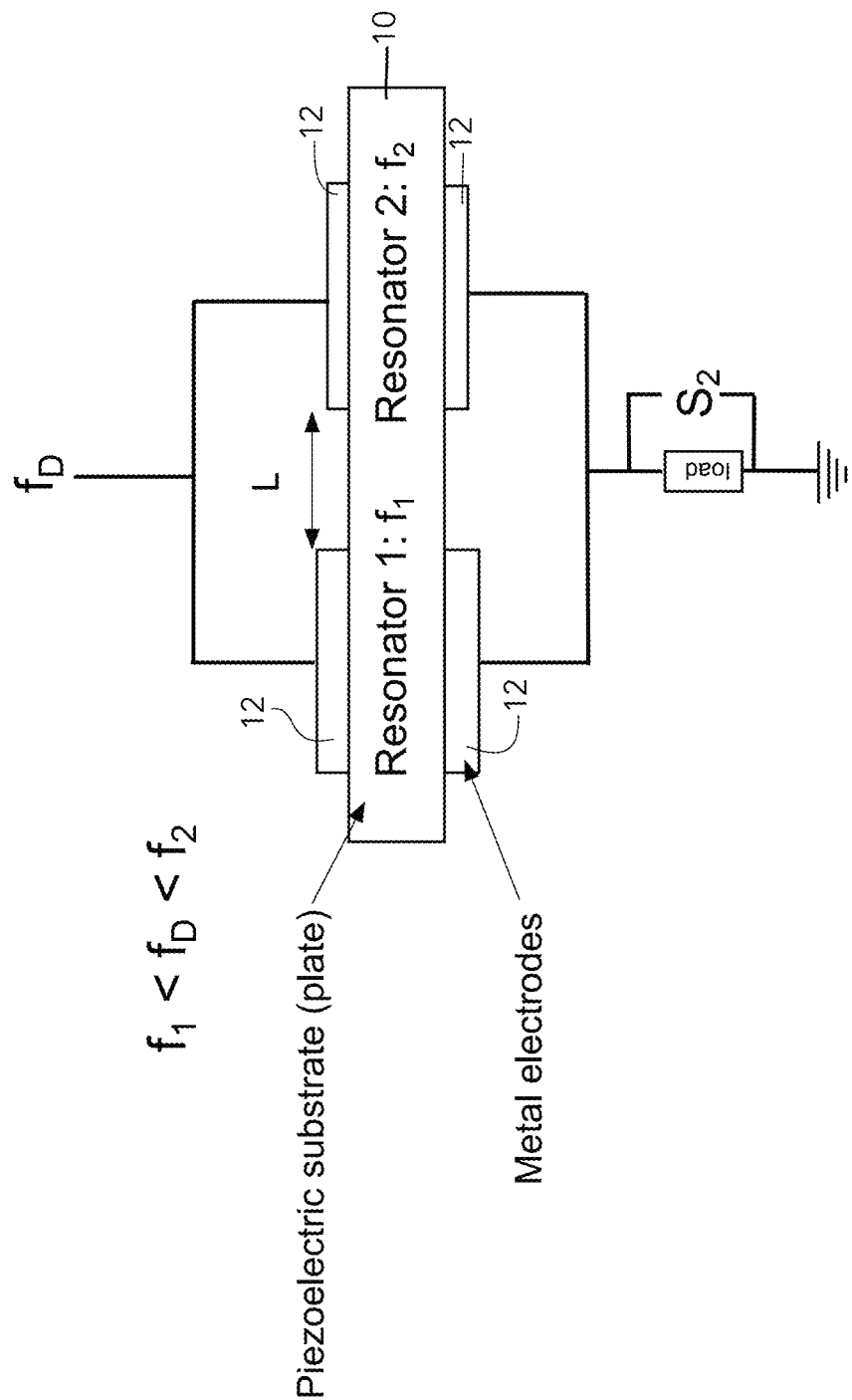
FIG. 1 is a schematic diagram of a First Embodiment showing both resonators driven in parallel with a non-linear output signal S2 being observed (see FIG. 1b) as a sum of the charge density on the two lower plates when the resonators are driven with a drive signal $f_D$ is of sufficient magnitude.

A first embodiment is now described with reference to FIGS. 1, 1a and 1b. A common piezoelectric substrate such as PZT, GaN, AlN, or quartz is used with electrodes for two resonators fabricated in close proximity to each other but with a gap between them is shown in FIG. 1. The electrodes can be made of metal films such as Au or Al. The gap dimension is denoted as L. For L being small compared to the acoustical wavelength of the modes excited, strong acoustical coupling can occur. Typically, L may range from 1-25 microns for VHF and UHF resonators. For shear-mode resonators, the frequencies of the fundamental and overtone modes are determined by the thicknesses of the substrate and/or the metal electrodes. By varying either or both of these thicknesses between the two resonators, two coupled resonators can be formed to resonate at different frequencies, $f_1$ and $f_2$, for similar or different vibratory modes (both resonators may resonate in a shear mode or they may resonate in different modes). The geometry of the active areas or electrodes of the two resonators do not necessarily have to be rectangular as depicted by the figures. They could be any convenient shape including circular or annular and the two resonators may have different geometries when viewed top down, for example. The typical frequency differences between $f_1$ and $f_2$ are preferably in the range of 1 kHz to 1 MHz for HF through UHF operation. If both top electrodes are then driven with an external frequency generator at an appropriate frequency $f_D$ offset from the first resonant mode in each resonator and at an appropriate power level being applied to produce a nonlinear response as a phononic comb that can be measured on the connected bottom electrodes with a spectrum analyzer. The offset is typically less than the frequency difference between two adjacent modes. The phononic comb is the result of the time domain beating of the combined charge density on the electrodes. Preferably, the external drive frequency $f_D$ is between the resonant frequencies $f_1$ and $f_2$, of the two resonators.

Figure 2:
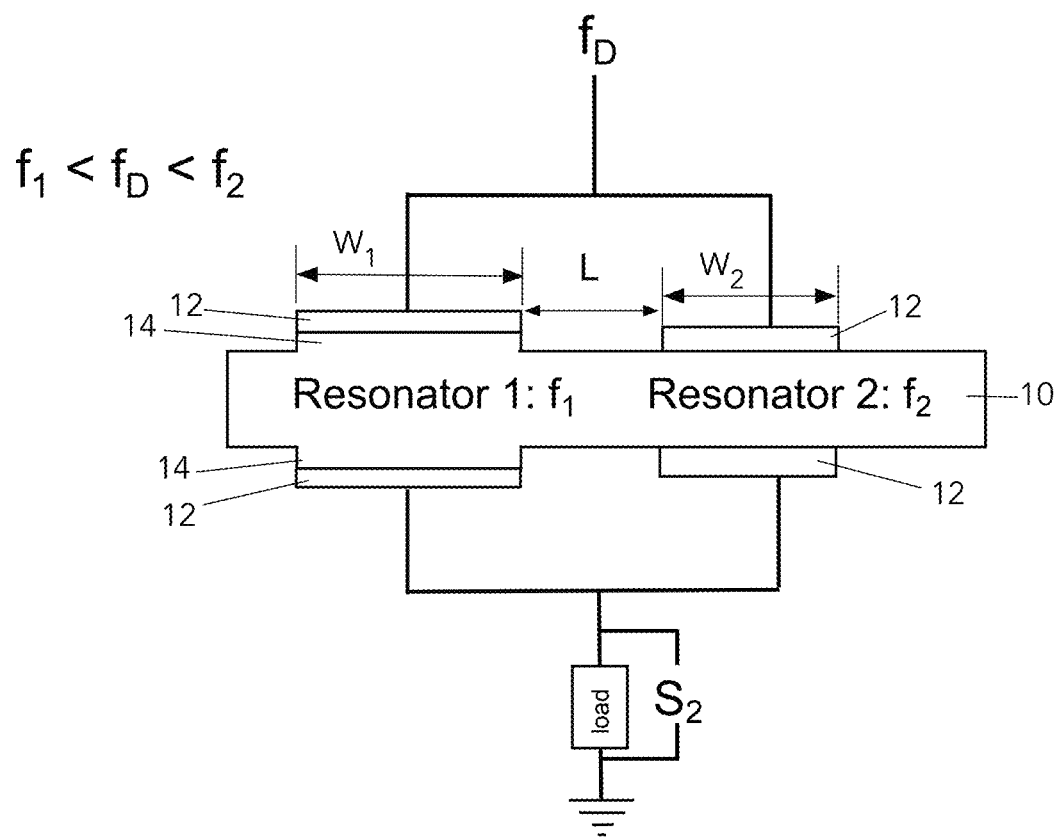
FIG. 2 is a schematic diagram of a Second Embodiment showing both resonators driven in parallel with the output signal S2 observed (see FIG. 1b) as a sum of the charge density on the two lower plates. In this embodiment the piezoelectric plate has a different thickness for one of the two resonators compared to the other resonator (formed as a mesa in the piezoelectric plate for resonator 1) and a different lateral size and thickness of the electrodes for resonator two. Inverted mesa designs are also possible. Various combinations of such modifications should now be apparent to those skilled in the art.

In FIG. 2, a variation of the first embodiment is shown (called a second embodiment herein) in which the piezoelectric plate 10 thickness is greater under resonator 1 than resonator 2, which can be accomplished by selective plasma or chemical etching of the substrate plate 10, the selective plasma or chemical etching defining a mesa 14 upon which the electrodes 12 of resonator 1 are formed. This increase in thickness of the substrate plate 10 decreases the frequency of resonator 1, particularly if it is a shear mode resonator. In addition, the electrode 12 lateral dimensions of the resonators may be different (compare the width $W_1$ of resonator 1 with the width $W_2$ of resonator 2, where $W_1$ is greater than $W_2$). In this embodiment the metal electrode 12 thicknesses may also be different (the thickness of electrodes of resonator 2 is greater than that of for resonator 1). Various combinations of these lithographic changes in the resonator design and dimensions may be utilized to shift the frequencies $f_1$ and $f_2$ of the resonant modes of the resonators, optimize the Q of the resonators, and/or improve their thermal stability for a given crystalline orientation of the substrate. Additionally, instead of forming a mesa 14 on the substrate (as is depicted for resonator 1 in FIG. 2), a region of the piezoelectric plate may be reduced, for example by selective etching in way of one of the two resonators so that, in either case, the piezoelectric substrate plate 10 has a different thickness for each resonator. These possible modifications, for example, mesa formation, selective etching of the piezoelectric plate, and forming electrodes of different thicknesses and spacings, are skills that should be within the skill set of a person or ordinary skill in this art. The electrodes 12 do not necessarily need to be rectangular in shape (when viewed top down) nor do they necessarily need to be made of the same electrically conductive material.

Figure 3:
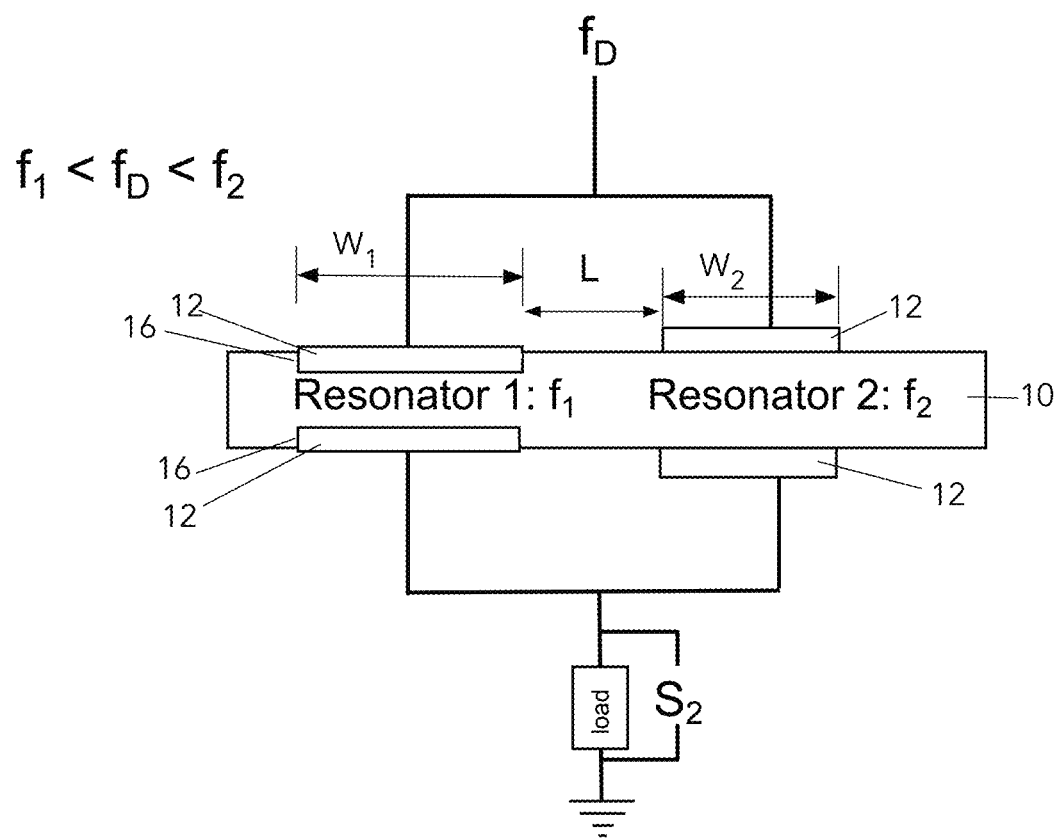
FIG. 3 is a schematic diagram of a Third Embodiment showing both resonators driven in parallel with the output signal S2 observed (see FIG. 1b) as a sum of the charge density on the two lower plates. In this embodiment the piezoelectric plate has a different thickness for one of the two resonators compared to the other resonator (formed as a channel in the piezoelectric plate for resonator 1) and a different lateral size and thickness of the electrodes for resonator two. Inverted mesa designs are also possible. Various combinations of such modifications should now be apparent to those skilled in the art.

FIG. 3 is an embodiment conceptually similar to the embodiment of FIG. 2 in that the piezoelectric plate 10 thickness is greater under one resonator than the other resonator, which, as before, can be accomplished by selective plasma or chemical etching of the substrate plate 10, the selective plasma or chemical etching in this embodiment defining a channel 16 in which the electrodes 12 of resonator 1 are fully or partially formed.

Figure 4:
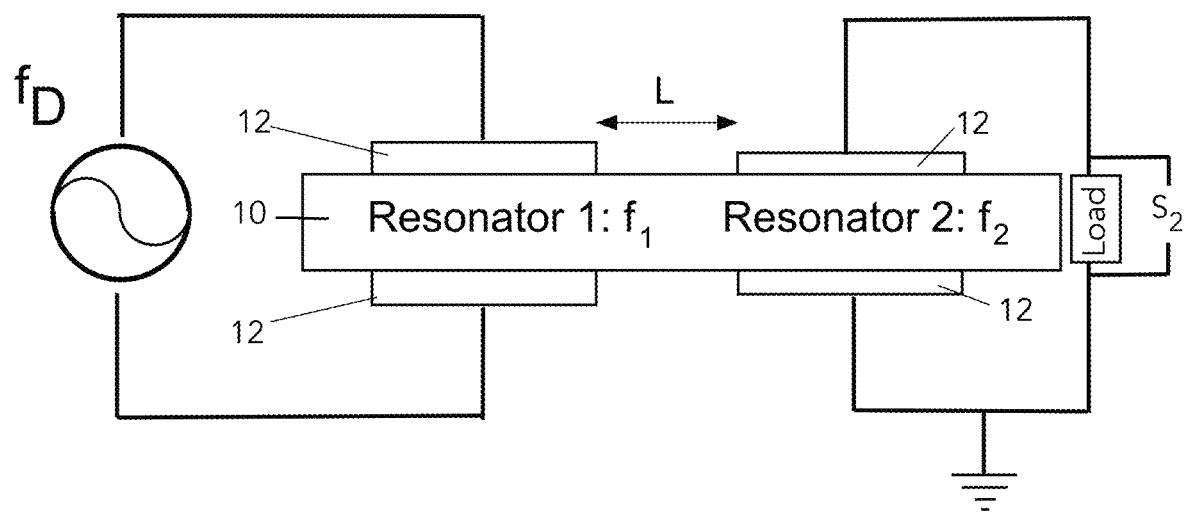
FIG. 4 is a schematic diagram showing the first resonator driven by an external signal generator and the comb generated on the second resonator through nonlinear coupling to the first resonator.

Another embodiment or variation is shown by FIG. 4. This this embodiment or variation, only the first resonator 1 is driven at a frequency $f_D$ between or near the resonant frequencies $f_1$ and $f_2$ of the first and second resonators 1, 2. Through nonlinear coupling to the second resonator 2 at an appropriate power level applied to resonator 1, a frequency comb is generated as measured by the charge density developed on the electrodes 12 of the second resonator (resonator 2).

Figure 1B:
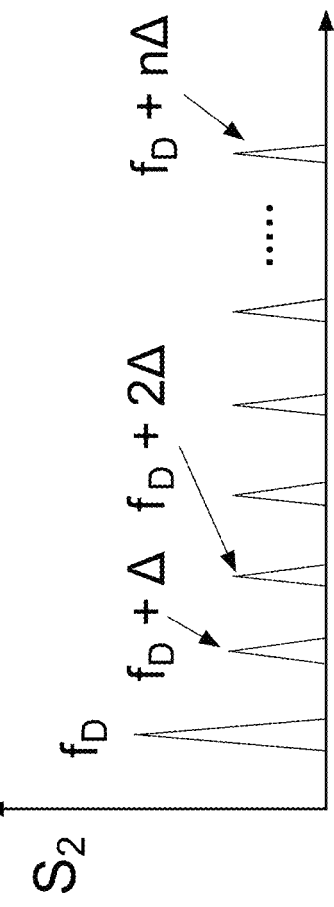
FIG. 1b is a graph showing the output signal S2 as a non-linear response when there is sufficient coupling between the two resonators and the drive signal $f_D$ is of sufficient magnitude to illicit the non-linear response.

Generally speaking, the power of the $f_D$ drive signal delivered to resonations 1 and 2 in the embodiments of FIGS. 1 and 2 or to resonator 1 in the embodiment of FIG. 4 is typically many orders of magnitude greater than that used in a conventional resonator-based oscillator operating a linear resonant mode in order to give rise to the non-linear response depicted by FIG. 1b.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ".

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A resonator structure comprising of two sets of top and bottom electrodes disposed on a common piezoelectric substrate forming first and second acoustically coupled resonators with different resonant frequencies and which are driven by common signal source on the top electrodes at a frequency between the two resonant frequencies and at a power sufficient for nonlinear operation, thereby producing a phononic frequency comb output.

2. A resonator structure of claim 1 in which the electrodes for said first resonator have different dimensions than the electrodes for said second resonator for the purpose of producing different resonant frequencies and different modal characteristics, the different dimensions being selected from the group consisting of electrode thickness and/or electrode lateral dimensions and the different modal characteristics being selected from the group consisting of which type of mode is excited in each resonator (shear, flexural, torsional, or anharmonic or overtone modes of each) and/or the Q, and/or nonlinear duffing and coupling constants of the resonators.

3. A resonator structure of claim 1 in which the piezoelectric substrate is formed into mesa regions under the two sets of electrodes with different dimensions under the said first and second set of electrodes for the purpose of producing different resonant frequencies and resonator modal characteristics.

4. A resonator structure of claim 1 in which the piezoelectric substrate is formed into inverted mesa regions under the two sets of electrodes with different dimensions under the said first and second set of electrodes for the purpose of producing different resonant frequencies and resonator modal characteristics.

5. A resonator structure of claim 1 in which the common piezoelectric substrate is composed of materials such as PZT, AlN, GaN, or crystalline quartz.

6. A resonator structure of claim 1 in which the frequency differences between the two resonators range between 1 kHz and 1 MHz.

7. A resonator structure of claim 1 in which the operating frequency is in the HF, VHF or UHF bands.

8. A resonator structure of claim 1 in which the separation between the resonators on the common piezoelectric substrate ranges from 1 to 25 microns.

9. A resonator structure consisting of two sets of top and bottom electrodes on a common piezoelectric substrate forming first and second acoustically coupled resonators with different resonant frequencies and which are driven by a signal source between the top and bottom electrodes of the said first resonator at a frequency between the two resonant frequencies and at a power needed for nonlinear operation, thereby producing a phononic frequency comb across the electrodes of the said second resonator.

10. A resonator structure of claim 9 in which the electrodes for said first resonator have different dimensions than the electrodes for said second resonator for the purpose of producing different resonant frequencies, Qs and/or nonlinear duffing constants.

11. A resonator structure of claim 9 in which the piezoelectric substrate is formed into mesa regions under the two sets of electrodes with different dimensions under the said first and second set of electrodes for the purpose of producing different resonant frequencies, Qs, and/or non-linear duffing constants.

12. A resonator structure of claim 9 in which the piezoelectric substrate is formed into inverted mesa regions under the two sets of electrodes with different dimensions under the said first and second set of electrodes for the purpose of producing different resonant frequencies, Qs, and/or non-linear duffing constants.

13. A resonator structure of claim 9 in which the common piezoelectric substrate is composed of materials such as PZT, AlN, GaN, or crystalline quartz.

14. A resonator structure of claim 9 in which the frequency differences between the two resonators range between 1 kHz and 1 MHz.

15. A resonator structure of claim 9 in which the operating frequency is in the HF, VHF or UHF bands.

16. A resonator structure of claim 9 in which the separation between the resonators on the common piezoelectric substrate ranges from 1 to 25 microns.

* * * * *